United States Patent
Wu et al.

(10) Patent No.: US 6,495,472 B2
(45) Date of Patent: Dec. 17, 2002

(54) METHOD FOR AVOIDING EROSION OF CONDUCTOR STRUCTURE DURING REMOVING ETCHING RESIDUES

(75) Inventors: Chih-Ning Wu, Hsin-Chu (TW); Chan-Lon Yang, Taipei (TW)

(73) Assignee: United Microelectronics Corps. (TW)

( * ) Notice: Subject to any disclaimer, the term of this patent is extended or adjusted under 35 U.S.C. 154(b) by 0 days.

(21) Appl. No.: 09/791,027

(22) Filed: Feb. 21, 2001

(65) Prior Publication Data

US 2002/0115296 A1 Aug. 22, 2002

(51) Int. Cl.$^7$ .............................................. H01L 21/302
(52) U.S. Cl. ..................... 438/745; 438/747; 438/749; 438/751; 438/754; 438/756; 438/757
(58) Field of Search ................................. 438/745, 747, 438/749, 751, 754, 756, 757

(56) References Cited

U.S. PATENT DOCUMENTS 5,962,385 A * 10/1999 Maruyama et al. ......... 510/176
5,990,015 A * 11/1999 Lin et al. .................... 438/706
6,123,088 A * 9/2000 Ho .............................. 134/1.3

* cited by examiner

*Primary Examiner*—Felisa Hiteshew
*Assistant Examiner*—Binh X. Tran
(74) *Attorney, Agent, or Firm*—Powell Goldstein Frazer & Murphy LLP

(57) ABSTRACT

A method for avoiding erosion of a conductor structure during a procedure of removing etching residues is provided. The method provides a semiconductor structure and the conductor structure formed therein. A cap layer is formed on the conductor structure and the semiconductor and a dielectric layer formed thereon. The dielectric layer and the cap layer are then etched to partially expose the conductor structure. The etching residues are removed with an amine-containing solution and the amine-containing solution is removed with an intermediate solvent to avoid erosion of the exposed conductor structure. As a key step of the present invention, the intermediate solvent comprises N-methylpyrrolidone or isopropyl alcohol and can protect the conductor structure from erosion.

14 Claims, 5 Drawing Sheets

METHOD FOR AVOIDING EROSION OF CONDUCTOR STRUCTURE DURING REMOVING ETCHING RESIDUES

BACKGROUND OF THE INVENTION

1. Field of the Invention

The invention relates to a method for post-etch cleaning for dual damascene, and more particularly to a method for post-etch cleaning that does not result in Cu erosion after post-etch cleaning.

2. Description of the Prior Art

Cleaning processes typically play an important role in the formation of integrated circuit (i.e., semiconductor) devices. Specifically, the cleaning processes are often necessary since wafers utilized in the devices usually become contaminated during processing.

When the DRAM chip has a memory of 1 gigabit, and a typical CPU has 13 million transistors/$cm^2$, the number of metal layers (the "wires") would increase from the current 2–3 to 5–6 and the operating frequency, which is currently 200 MHz, would increase to 500 MHz. This would increase the need for a three-dimensional construction on the wafer chip to reduce delays of the electrical signals. Newer methods to etch, planarize and to clean the wafers after each of these critical steps must be developed. Usually the amine-based chemistries are used to remove post etching residues ("polymer residues," "fences," vails, etc.).

At some point during the wet chemical processing (for metal etching or post etching residue removal, etc.) of a wafer in the semiconductor industry (or flat panel displays, microelectro-mechanical devices, etc.), the material must "move through" a rinse step, or a post-clean treatment step. Such rinse steps are design to remove the chemicals applied in the previous step and stop any further chemical effects from the previous chemicals. These solutions are also designed to reduce particles on the substrate surfaces. FIG. 1 is a flow chart for post-etch cleaning. First, amine-based solvent removes photoresist materials (step 101); then deionized water rinse subsequently removes the residues (step 102). Next, nitrogen gas is used to dry the wafer (step 103) and then spin dry is finally used to dry the wafer (step 104).

FIG. 2A is a cross-sectioned diagram illustrating a Cu/low-k dual damascene structure. A copper conductor structure 130 is adjacent to a first low-k dielectric layer 110 and a cap layer 140 is formed thereon. An etched second low-k dielectric layer 120 with a pattern is on the cap layer 140. Next, as shown in FIG. 2B, for removing the cap layer 140 and etching residues, a conventional amine-based solvent is used such that copper recess in the copper conductor structure 130 is observed and shown as a dash line 150. Next, depicted in FIG. 2C, after copper material is filled by physical vapor deposition (PVD) and electroplate chemical deposition (ECD) and is thereafter planarized, there are still voids 160 formed. The voids 160 enable the copper molecules in the copper conductor structure diffusing and migrating during substantial thermal cycles of process, and further result in poor reliability and resistance shifting. However, in a Cu/spin-on low-k dual damascene device, the combination of water and alkanolamine contained therein can attack the metallic layers. The addition of a corrosion inhibitor to these products can mitigate to a certain extent the unwanted attack on the metallic layers and oxide layers. Furthermore, since these products have a high pH, even in the presence of a corrosion inhibitor, they may attack certain corrosion-sensitive metal layers. Particularly, metal layers such as aluminum, titanium nitride, copper and the like are particularly corrosion sensitive. The Cu erosion can result in electrical shifting, so it is important to eliminate the Cu corrosion problem.

SUMMARY OF THE INVENTION

It is an object of the present invention to provide a method for eliminating corrosion during the procedure of cleaning etching residues. An intermediate solvent containing N-methylpyrrolidone compound is applied to removing the material resulting in corrosion.

It is another object of the present invention to provide a method for preventing copper erosion during the procedure of cleaning etching residues. The residue amine during cleaning procedure can be removed by an isopropyl alcohol-contained solvent, so as to prevent the combination of amine residue and deionized water and copper erosion.

In the present invention, a method for avoiding erosion of a conductor structure during a procedure of removing etching residues is provided. The method provides a semiconductor structure and the conductor structure formed therein. A cap layer is formed on the conductor structure and the semiconductor and a dielectric layer formed thereon. The dielectric layer and the cap layer are then etched to partially expose the conductor structure. The etching residues are removed with an amine-containing solution (e.g. EKC525) and the amine-containing solution is removed with an intermediate solvent to avoid erosion of exposed the conductor structure. As a key step of the present invention, the intermediate solvent comprises N-methylpyrrolidone or isopropyl alcohol and can prevent the conductor structure from being eroded.

BRIEF DESCRIPTION OF THE DRAWINGS

A better understanding of the invention may be derived by reading the following detailed description with reference to the accompanying drawings wherein.

DESCRIPTION OF THE PREFERRED EMBODIMENT

Semiconductor devices of the present invention are applicable to a broad range of semiconductor devices and can be fabricated from a variety of semiconductor materials. While the invention is described in terms of a single preferred embodiment, those skilled in the art will recognize that many steps described below can be altered and that species and types of substrate and dopant as well as other material substitutions can be freely made without departing from the spirit and scope of the invention.

Furthermore, there is shown a representative portion of a semiconductor structure of the present invention in enlarged, cross-sections of the two dimensional views at several stages of fabrication. The drawings are not necessarily to scale, as the thickness of the various layers are shown for clarity of illustration and should not be interpreted in a limiting sense. Accordingly, these regions will have dimensions, including length, width and depth, when fabricated in an actual device.

A method of avoiding erosion of a copper conductor structure during a procedure of removing etching residues is disclosed. The method provides a semiconductor structure and the copper conductor structure formed therein. A cap layer is formed on the conductor structure and the semiconductor and a dielectric layer is formed thereon. The dielectric layer and the cap layer are etched partially to expose the conductor structure. Next, the etching residues are removed with an amine-containing solution (e.g. EKC525). Then the amine-containing solution is removed with an intermediate solvent to avoid erosion of the exposed conductor structure. The intermediate comprises an N-methylpyrrolidone (NMP) compound. The etching residues are also removed by deionized water. The method can also provide a semiconductor structure and the copper conductor structure formed therein. A silicon nitride layer is formed on the copper conductor structure and the semiconductor structure. A first low dielectric constant dielectric layer is formed on the silicon nitride layer. The first low dielectric constant dielectric layer and the silicon nitride layer are etched to partially expose the copper conductor structure. The etching residues are removed with an amine-containing solution. The amine-containing solution is removed with an isopropyl alcohol (IPA)-containing intermediate solvent to avoid erosion of the exposed conductor structure. The etching residues are also removed by deionized water.

Figure 1:
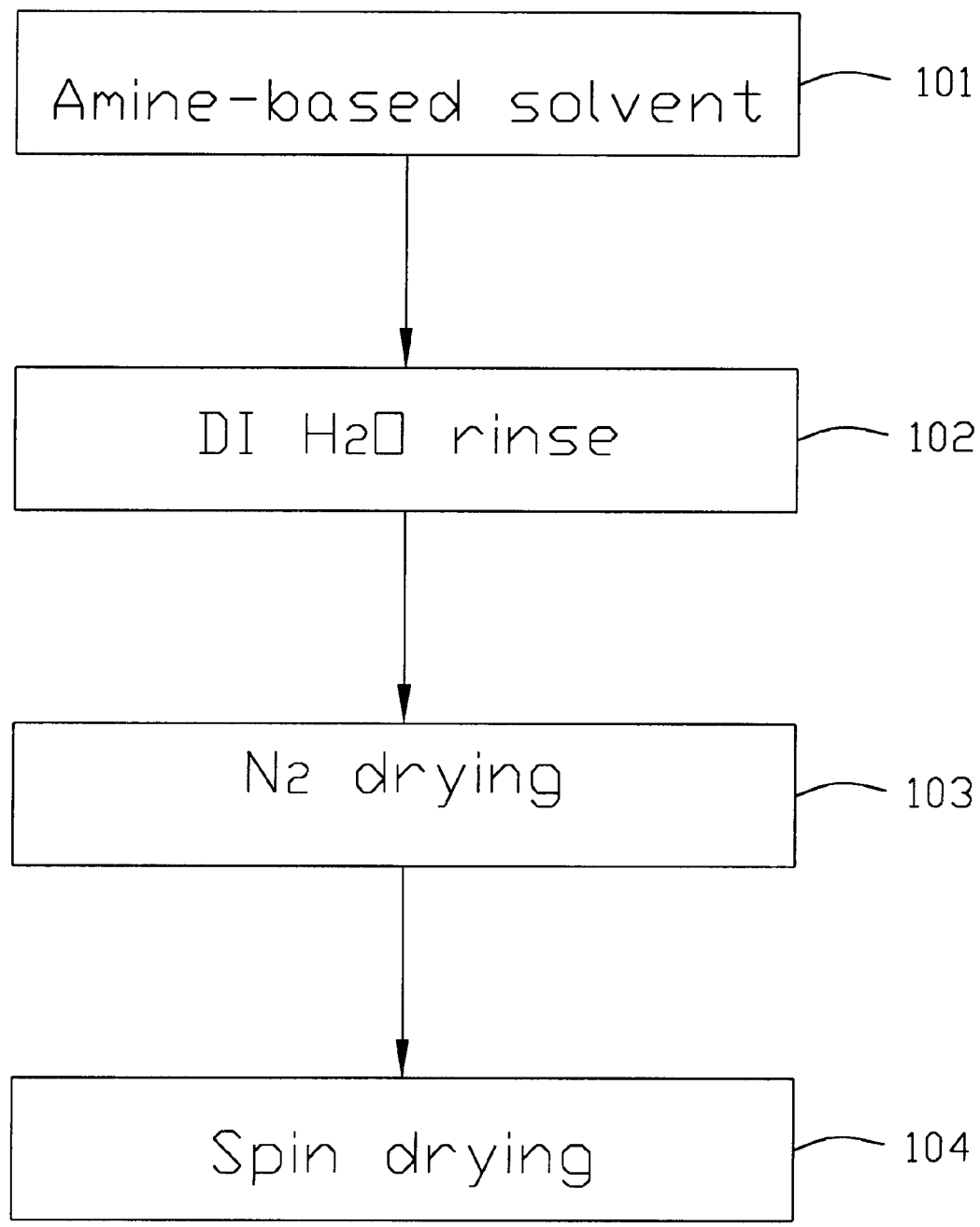
FIG. 1 is a flow chart of the conventional procedure of cleaning etching residues.
Figure 2A:
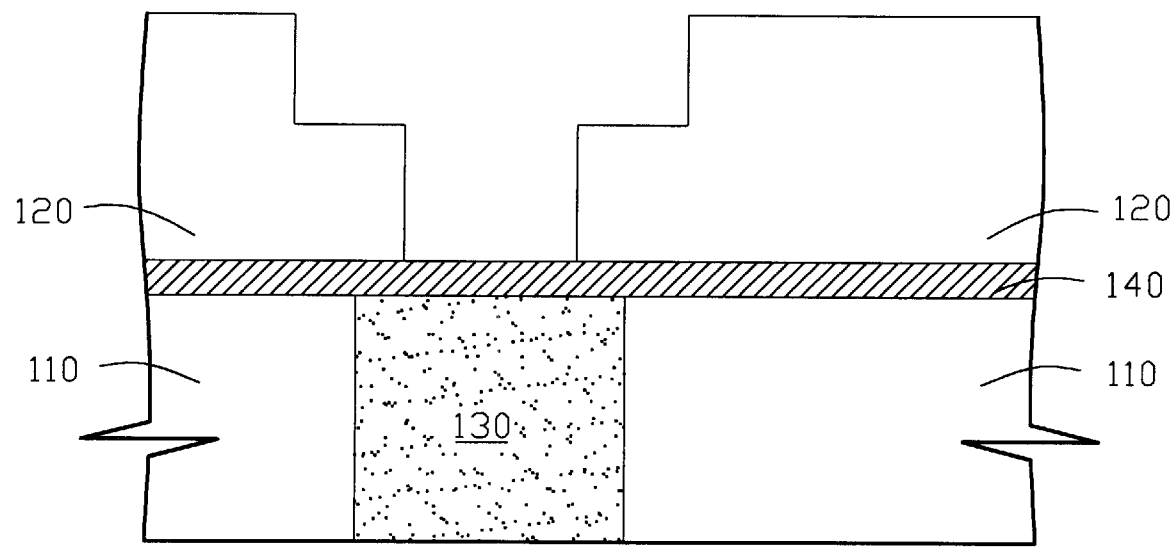
FIGS. 2A to 2C are a series of cross-sectional diagrams illustrating Cu/low-k dual damascene structure using conventional cleaning.
Figure 2B:
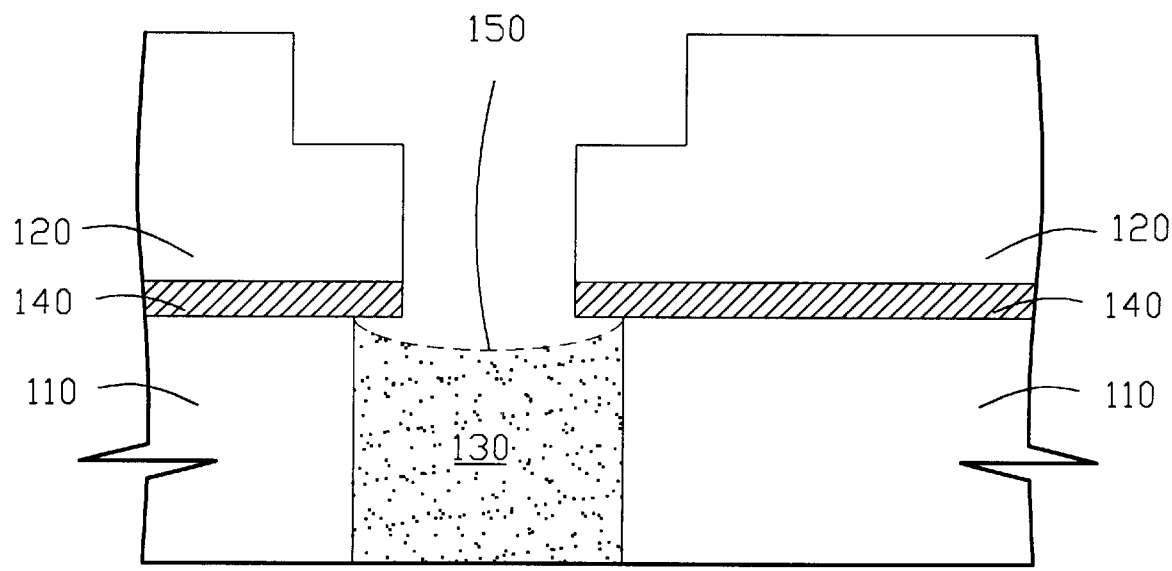
Figure 2C:
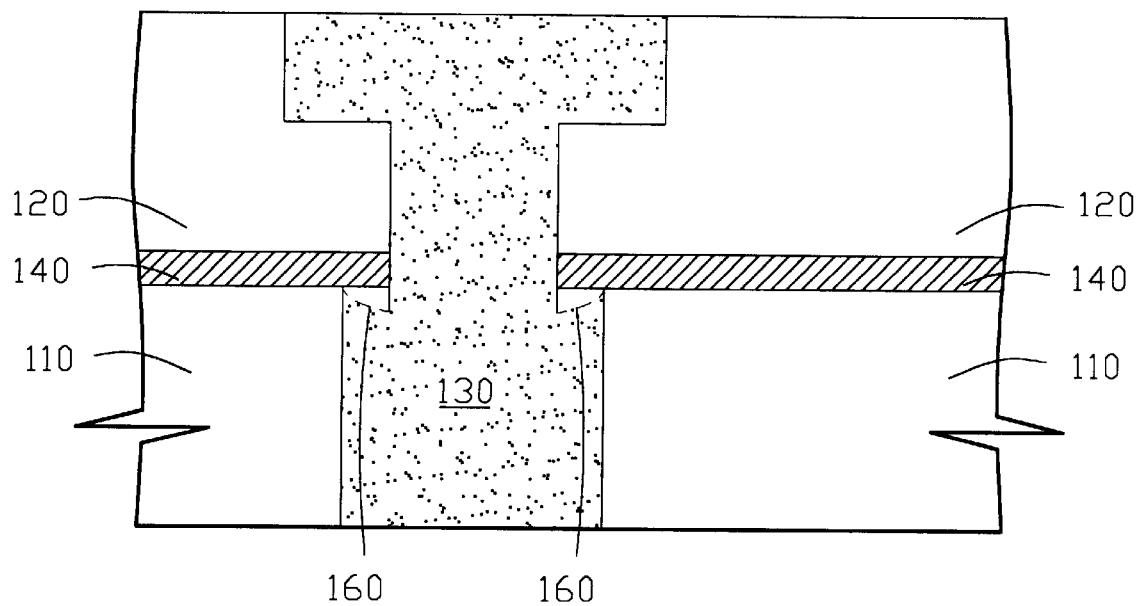
Figure 3:
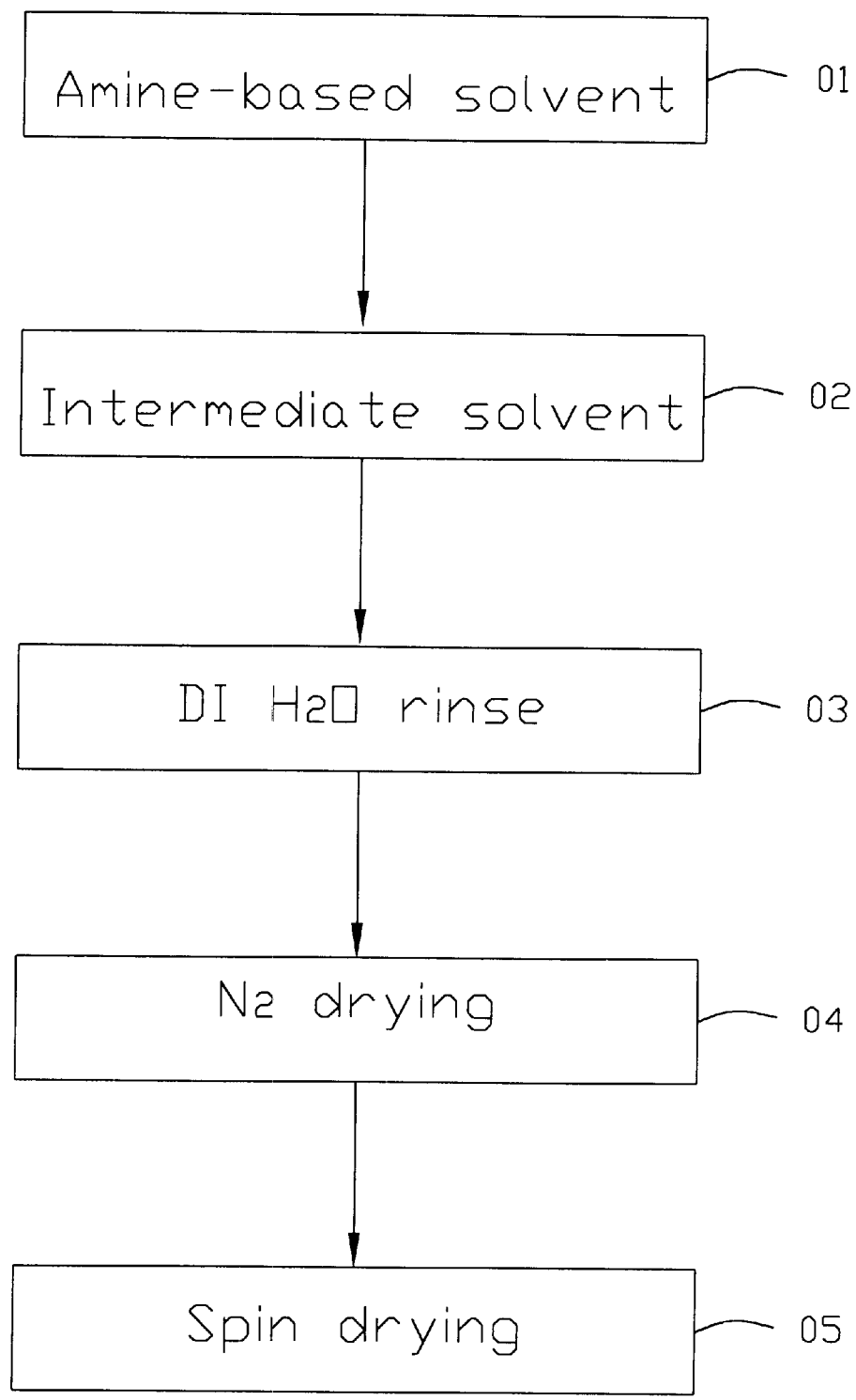
FIG. 3 is a flow chart of a procedure of cleaning etching residues with respect to the present invention.

FIG. 3 is a flow chart for post-etch cleaning of the present invention. Basically, the first cleaning step also uses amine-based solvent (e.g., EKC525) to remove the etching residues (step 01). Next is a key step of the present invention, where an intermediate solvent is used for replacing the residue amine that may generate hydroxide ions in deionized water (step 02). Those hydroxide ions may cause conductor erosion. To be specific, the intermediate solvent is an organic solvent with high volatility. In the embodiment, NMP (N-methylpyrrolidone) or IPA (isopropyl alcohol) is used as an intermediate rinse. The intermediate rinse can solve the residue amine and further prevent conductive line, such as the copper line, from being eroded. Furthermore, the addition of the intermediate step does not result in an addition of the cleaning apparatus. It can be applied for both spray-type and batch-type wet stations. Next, deionized water is used for the rinse (step 03). Without amine residue, the deionized water does not produce hydroxide ions that attack the conductive line. The wafer is then dried by using nitrogen gas (step 04) and finally by spin drying (step 05).

Figure 4A:
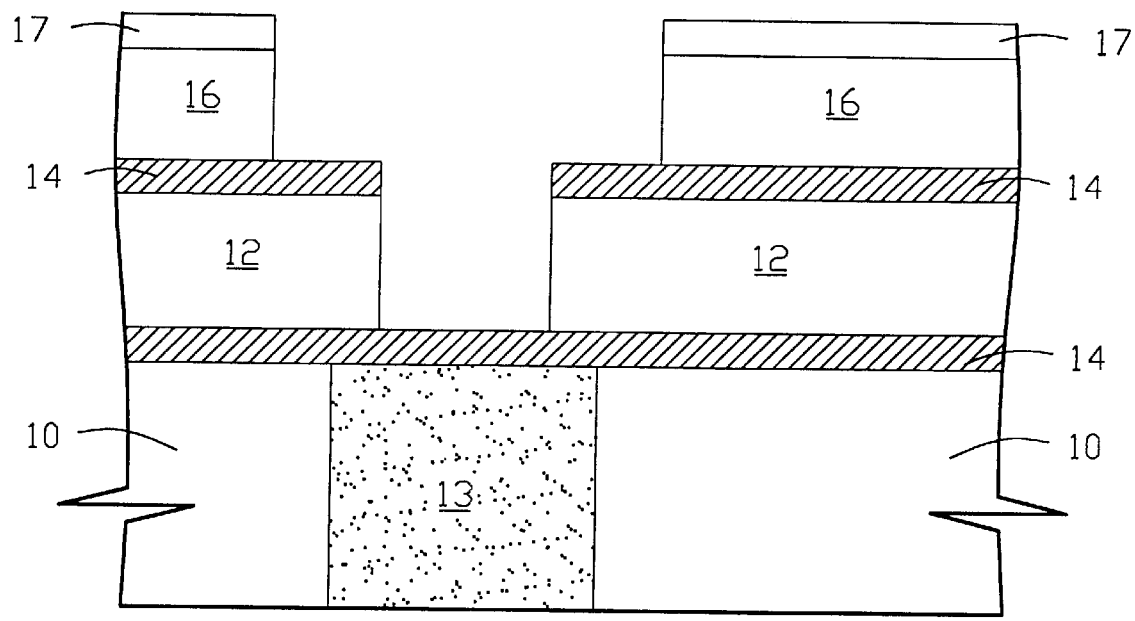
FIGS. 4A to 4B are a series of cross-sectional views illustrating a Cu/lowk dual damascene structure of the present invention.

Referring to FIG. 4A, a semiconductor structure, such as a dual damascene structure, comprises a copper conductor structure 13, a first low K dielectric layer 10 and a cap layer 14. Moreover, the cap layer 14 is also between an etched second low K dielectric layer 12 and a third low K dielectric layer 16. A mask 17 is used for pattern definition of the etched third low K dielectric layer 16. Furthermore, all low K dielectric layers have dielectric constants smaller than 2.6, and are formed by chemical vapor deposition or the spin on method. Of course, the mask 17 is a hard mask when the third low K dielectric layer 16 is formed by the spin on method, while it is a photo resist when the third low K dielectric layer 16 is by chemical vapor deposition.

Figure 4B:
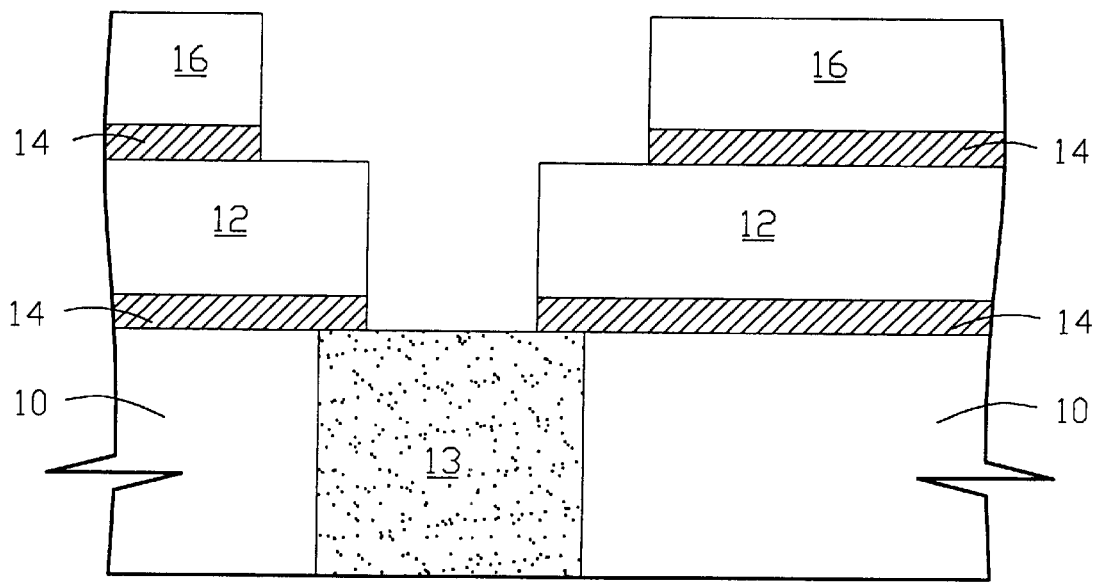

A key step of the present invention is to remove the exposed cap layer and etching residues. Shown on FIG. 4B, the amine-based solvent is first used to remove the etching residues. Next is a key step of the present invention. An intermediate rinse, such as NMP or IPA, is used for the advantages of total solubility with the residue amine and high volatility. Next, deionized water is used followed by nitrogen and spin drying to clean the wafer. Without amine residue, the deionized water cannot produce hydroxide ions to attack the copper conductor structure 13 and further result in erosion of the copper conductor structure 13.

Although this invention is described relative to specific dielectric materials, conductive materials and an apparatus for depositing and etching these materials, it is not limited to such materials and other materials and apparatuses for depositing the etching dielectric and conductive materials can be substituted as is well understood by those skilled in the microelectronics multilayer interconnection arts.

Further, although the embodiments of the present invention are directed to dual damascene on semiconductor devices, it also will be recognized by those skilled in multilayer interconnection substrate arts that the present invention can be used in fabricating those substrate packages to interconnect the electronic system and the single damascene structure. Such multilevel or multilayer substrates use organic insulating layers, such as polyimides, and conductive lines, such as aluminum. The dual damascene process of the present invention with a protective mask for via etching is well suited for the manufacture of such multilevel insulating and conductive layers with connecting conductive vias.

What is claimed is:

1. A method for avoiding erosion of conductor structure during a procedure of removing etching residues, said method comprising:

providing a semiconductor structure and said conductor structure formed t herein, a cap layer on said conductor structure and said semiconductor structure, and a dielectric layer on said cap layer;

etching said dielectric layer and cap layer to expose partial said conductor structure;

removing said etching residues with an amine-contained solution; and removing said amine-contained solution with an intermediate solvent to avoid erosion of exposed said conductor structure.

2. The method according to claim 1 further comprising removing said etching residues by deionized water.

3. The method according to claim 1, wherein said intermediate solvent comprises an N-methylpyrrolidone (NMP) compound.

4. The method according to claim 1, wherein said intermediate solvent comprises an isopropyl alcohol (IPA) compound.

5. The method according to claim 1, wherein said cap layer comprises a silicon nitride layer.

6. The method according to claim 1, wherein said dielectric layer comprises a low dielectric constant dielectric layer formed by a spin-on method.

7. The method according to claim 1, wherein said dielectric layer comprises a low dielectric constant dielectric layer formed by chemical vapor deposition.

8. The method according to claim 1, wherein said conductor structure is made of copper material.

9. A method for avoiding erosion of a copper conductor structure during a procedure of removing etching residues, said method comprising:

providing a semiconductor structure and said copper conductor structure formed therein, and a first low dielectric constant dielectric layer on said copper conductor structure and said semiconductor structure;

etching said first low dielectric constant dielectric layer to expose partial said copper conductor structure;

removing said etching residues with an amine-contained solution;

removing said amine-contained solution with an intermediate solvent to avoid erosion of exposed said copper conductor structure, said intermediate comprising an N-methylpyrrolidone (NMP) compound; and removing said etching residues by deionized water.

10. The method according to claim 9, wherein said first low dielectric constant dielectric layer is formed by a spin-on method.

11. The method according to claim 9, wherein said first low dielectric constant dielectric layer is formed by chemical vapor deposition.

12. A method for avoiding erosion of a copper conductor structure during a procedure of removing etching residues, said method comprising:

providing a semiconductor structure and said copper conductor structure formed therein;

forming a silicon nitride layer on said copper conductor structure and said semiconductor structure;

forming a first low dielectric constant dielectric layer on said silicon nitride layer;

etching said first low dielectric constant dielectric layer and said silicon nitride layer to expose partial said copper conductor structure;

removing said etching residues with an amine-contained solution;

removing said amine-contained solution with an isopropyl alcohol (IPA)-contained intermediate solvent to avoid erosion of exposed said conductor structure; and removing said etching residues by deionized water.

13. The method according to claim 12, wherein said first low dielectric constant dielectric layer is formed by a spin-on method.

14. The method according to claim 12, wherein said first low dielectric constant dielectric layer is formed by chemical vapor deposition.

\* \* \* \* \*